US012560748B1

(12) United States Patent
Kleiman-Shwarsctein et al.

(10) Patent No.: US 12,560,748 B1
(45) Date of Patent: Feb. 24, 2026

(54) OPTICAL COMPONENT WITH EMBEDDED MASK

(71) Applicant: Apple Inc., Cupertino, CA (US)

(72) Inventors: Alan Kleiman-Shwarsctein, Santa Clara, CA (US); Alexander Feldman, Los Altos, CA (US); Adar Magen, Sunnyvale, CA (US)

(73) Assignee: Apple Inc., Cupertino, CA (US)

( * ) Notice: Subject to any disclaimer, the term of this patent is extended or adjusted under 35 U.S.C. 154(b) by 782 days.

(21) Appl. No.: 17/818,914

(22) Filed: Aug. 10, 2022

Related U.S. Application Data

(60) Provisional application No. 63/235,599, filed on Aug. 20, 2021.

(51) Int. Cl.
| | |
|---|---|
| *G02B 5/00* | (2006.01) |
| *C03B 23/22* | (2006.01) |
| *C03C 17/22* | (2006.01) |
| *C03C 17/23* | (2006.01) |
| *C03C 27/06* | (2006.01) |
| *C23C 14/04* | (2006.01) |

(Continued)

(52) U.S. Cl.
CPC .............. *G02B 5/003* (2013.01); *C03B 23/22* (2013.01); *C03C 17/22* (2013.01); *C03C 17/23* (2013.01); *C03C 27/06* (2013.01); *C23C 14/042* (2013.01); *C23C 14/5886* (2013.01); *C23C 16/042* (2013.01); *C23C 16/56* (2013.01); *G02B 5/04* (2013.01); *C03C 2218/119* (2013.01); *C03C 2218/152* (2013.01); *C03C 2218/154* (2013.01); *G02B 1/10* (2013.01)

(58) Field of Classification Search
None
See application file for complete search history.

(56) References Cited

U.S. PATENT DOCUMENTS

| | | | |
|---|---|---|---|
| 8,269,301 | B2 | 9/2012 | Hata et al. |
| 8,773,848 | B2 | 7/2014 | Russell-Clarke et al. |

(Continued)

FOREIGN PATENT DOCUMENTS

| | | | | |
|---|---|---|---|---|
| JP | | H0815308 | A * | 7/1994 |

OTHER PUBLICATIONS

Machine translation of Tamura Masaya et al JPH0815308A (Year: 1994).*
English translation (Year: 1994).*

*Primary Examiner* — Lucy P Chien
(74) *Attorney, Agent, or Firm* — Robert C. Kowert; Kowert, Hood, Munyon, Rankin & Goetzel, P.C.

(57) ABSTRACT

A glass optical component with embedded mask may be formed from multiple, discrete glass member components using a non-adhesive bonding process. A black mask may be created at a surface of a first member component using a deposition or a printing-and-sintering process. A backfill coating may then be applied to and then polished at the surface of the first member component. Next, the first member component may be bonded with a second member component, with the non-adhesive bonding process, at the surface of the first member component to form the optical component with the black mask embedded between the first and second member components. In addition, the glass optical component forming process may be implemented on a glass wafer level to make multiple glass optical components at a same time.

20 Claims, 14 Drawing Sheets

(51) Int. Cl.
| | |
|---|---|
| *C23C 14/58* | (2006.01) |
| *C23C 16/04* | (2006.01) |
| *C23C 16/56* | (2006.01) |
| *G02B 1/10* | (2015.01) |
| *G02B 5/04* | (2006.01) |

(56) References Cited

U.S. PATENT DOCUMENTS

| | | | |
|---|---|---|---|
| 8,980,115 B2 | 3/2015 | Bibl et al. | |
| 2008/0245765 A1* | 10/2008 | Khaselev | H10F 71/00 |
| | | | 216/13 |
| 2010/0066683 A1* | 3/2010 | Chang | B32B 37/025 |
| | | | 345/173 |
| 2016/0377972 A1* | 12/2016 | Hofmann | C03C 10/0027 |
| | | | 430/5 |
| 2019/0212632 A1* | 7/2019 | Miller | H04N 23/54 |
| 2021/0028077 A1 | 1/2021 | Bellman et al. | |

\* cited by examiner

Embedded mask 110

Outer masking 145

Coating 135

Outer masking 150

Embedded mask 105

Coating 140

Glass optical component 100

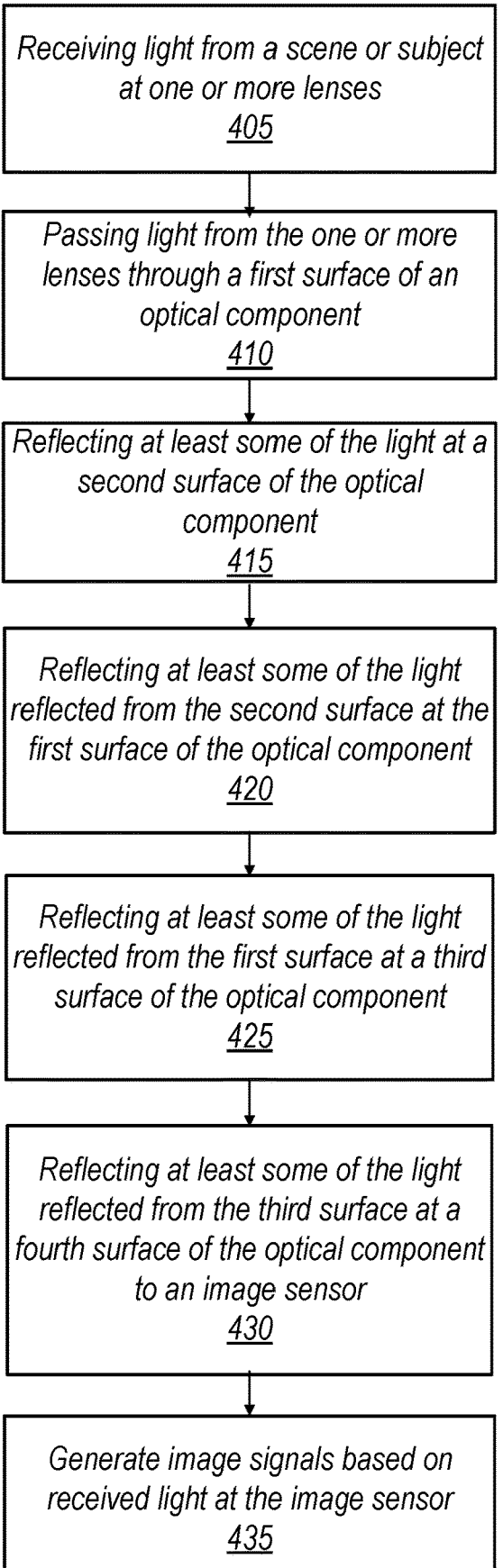

*Receiving light from a scene or subject at one or more lenses*
405

*Passing light from the one or more lenses through a first surface of an optical component*
410

*Reflecting at least some of the light at a second surface of the optical component*
415

*Reflecting at least some of the light reflected from the second surface at the first surface of the optical component*
420

*Reflecting at least some of the light reflected from the first surface at a third surface of the optical component*
425

*Reflecting at least some of the light reflected from the third surface at a fourth surface of the optical component to an image sensor*
430

*Generate image signals based on received light at the image sensor*
435

*FIG. 4*

Bottom view of 1st glass wafer

Mask 510

501

Cross-sectional view

510

505

501

Top view of 1st glass wafer

Mask 505

1st glass wafer 501

Cross-sectional view

505

501

Applying silicon oxide coating

Silicon oxide coating 515

505

501

Cross-sectional view

515

510

505

501

Polishing silicon oxide coating

515

505

501

Cross-sectional view

515

510

505

501

*Grinding to a parallelogram shape*

*Cross-sectional view*

*Cutting into bars*

*Cross-sectional view*

Cross-sectional view of a single die

Cross-sectional view

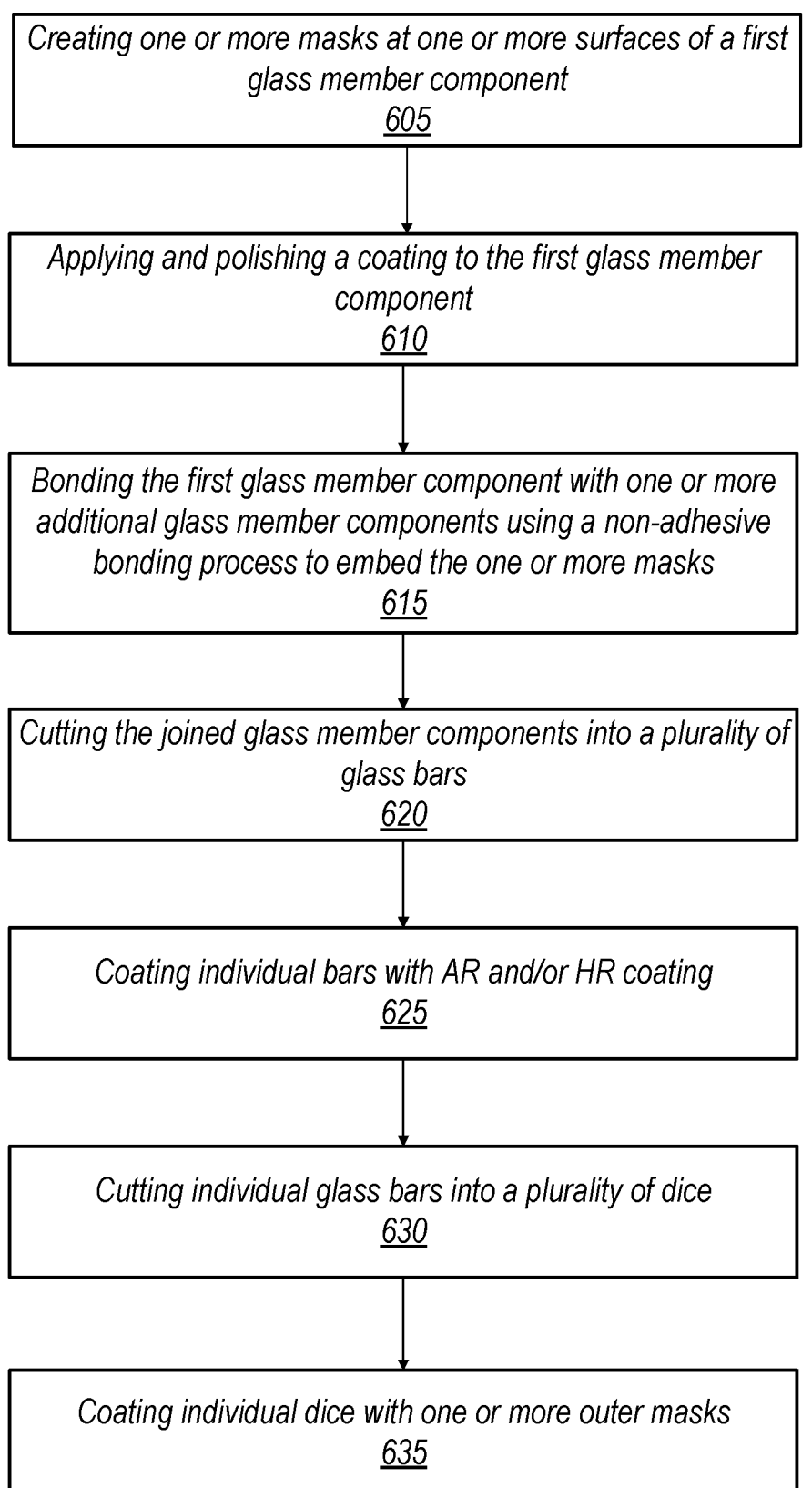

Creating one or more masks at one or more surfaces of a first glass member component
605

Applying and polishing a coating to the first glass member component
610

Bonding the first glass member component with one or more additional glass member components using a non-adhesive bonding process to embed the one or more masks
615

Cutting the joined glass member components into a plurality of glass bars
620

Coating individual bars with AR and/or HR coating
625

Cutting individual glass bars into a plurality of dice
630

Coating individual dice with one or more outer masks
635

*FIG. 6*

OPTICAL COMPONENT WITH EMBEDDED MASK

BACKGROUND

This application claims benefit of priority to U.S. Provisional Application Ser. No. 63/235,599, entitled "Optical Component with Embedded Mask," filed Aug. 20, 2021, and which is hereby incorporated herein by reference in its entirety.

TECHNICAL FIELD

This disclosure relates generally to an optical component and more specifically to a glass optical component with embedded mask.

DESCRIPTION OF THE RELATED ART

Optical components such as those made of glass are widely used in portable electronics, cameras, head-mounted devices (HMDs), etc. as part of optical systems for capturing and/or displaying images. A glass optical component, especially one having a relatively complex geometry, is generally created by joining together multiple discrete member glass components. Traditionally, the member components are combined together using an adhesive bonding process, where they can be glued with each other using an optical adhesive material. However, the adhesive bonding process is subject to reliability and/or performance issues. With the adhesive bonding process, it is hard to avoid gaps or voids at the joint between member components. Therefore, with aging, the bonding can delaminate or even completely fail. Further, thickness of the bonding layer between member components can vary significantly, e.g., in a range of several micrometers and beyond. Such evident variance can cause undesirable heterogenous optical performance of the optical component and impact passing of light from one member component to another. Therefore, it is desirable to have techniques to implement high-quality glass optical components from discrete member components.

BRIEF DESCRIPTION OF THE DRAWINGS

FIG. 4 shows a high-level flowchart of an example method for capturing images using a optical system including a glass optical system, according to some embodiments.

FIG. 6 is a high-level flowchart showing an example method for making an optical component, according to some embodiments.

Figure 1A:
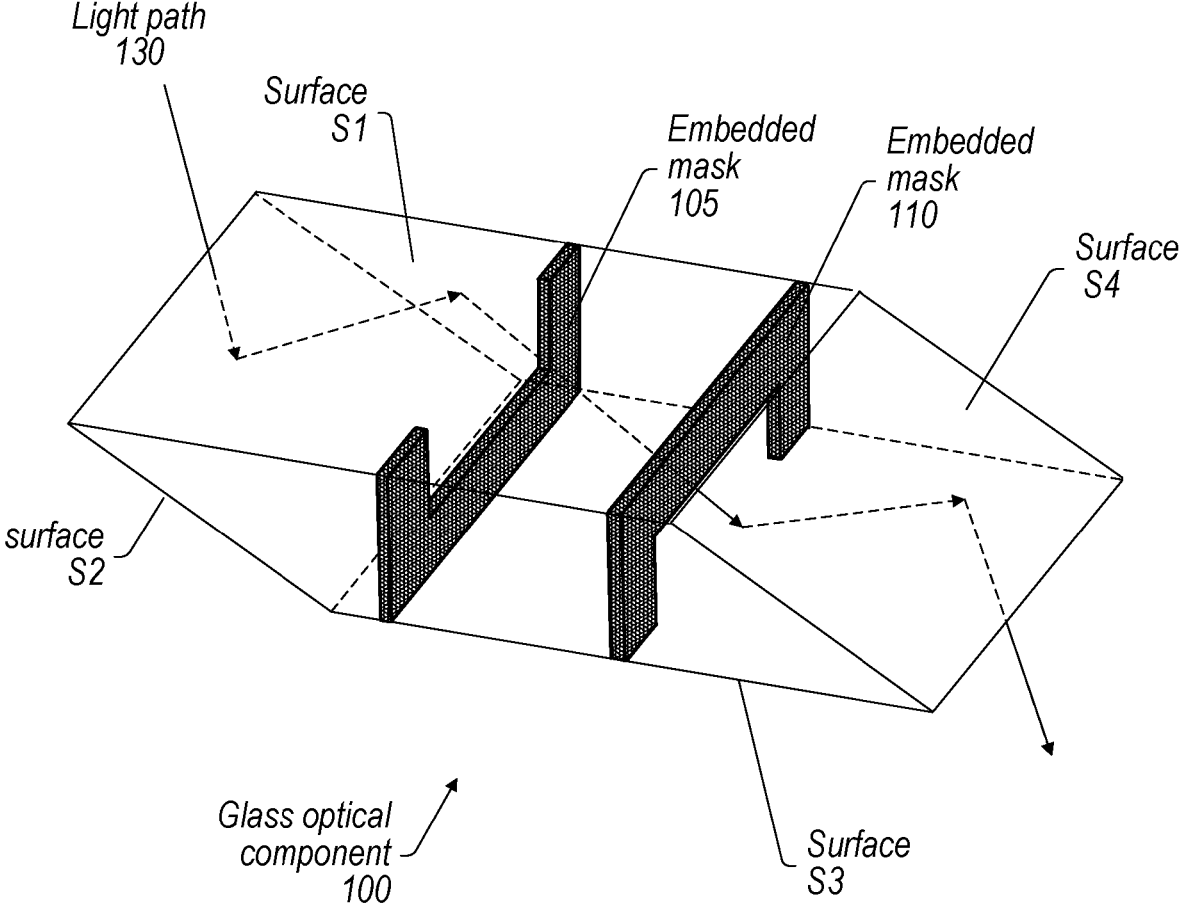
FIGS. 1A-1B show an example glass optical component with embedded mask, according to some embodiments.

This specification includes references to "one embodiment" or "an embodiment." The appearances of the phrases "in one embodiment" or "in an embodiment" do not necessarily refer to the same embodiment. Particular features, structures, or characteristics may be combined in any suitable manner consistent with this disclosure.

"Comprising." This term is open-ended. As used in the appended claims, this term does not foreclose additional structure or steps. Consider a claim that recites: "An apparatus comprising one or more processor units . . . . " Such a claim does not foreclose the apparatus from including additional components (e.g., a network interface unit, graphics circuitry, etc.).

"Configured To." Various units, circuits, or other components may be described or claimed as "configured to" perform a task or tasks. In such contexts, "configured to" is used to connote structure by indicating that the units/circuits/components include structure (e.g., circuitry) that performs those task or tasks during operation. As such, the unit/circuit/component can be said to be configured to perform the task even when the specified unit/circuit/component is not currently operational (e.g., is not on). The units/circuits/components used with the "configured to" language include hardware—for example, circuits, memory storing program instructions executable to implement the operation, etc. Reciting that a unit/circuit/component is "configured to" perform one or more tasks is expressly intended not to invoke 35 U.S.C. § 112(f) for that unit/circuit/component. Additionally, "configured to" can include generic structure (e.g., generic circuitry) that is manipulated by software and/or firmware (e.g., an FPGA or a general-purpose processor executing software) to operate in manner that is capable of performing the task(s) at issue. "Configure to" may also include adapting a manufacturing process (e.g., a semiconductor fabrication facility) to fabricate devices (e.g., integrated circuits) that are adapted to implement or perform one or more tasks.

"First," "Second," etc. As used herein, these terms are used as labels for nouns that they precede, and do not imply any type of ordering (e.g., spatial, temporal, logical, etc.). For example, a buffer circuit may be described herein as performing write operations for "first" and "second" values. The terms "first" and "second" do not necessarily imply that the first value must be written before the second value.

"Based On." As used herein, this term is used to describe one or more factors that affect a determination. This term does not foreclose additional factors that may affect a determination. That is, a determination may be solely based on those factors or based, at least in part, on those factors. Consider the phrase "determine A based on B." While in this case, B is a factor that affects the determination of A, such a phrase does not foreclose the determination of A from also being based on C. In other instances, A may be determined based solely on B.

It will also be understood that, although the terms first, second, etc. may be used herein to describe various elements, these elements should not be limited by these terms. These terms are only used to distinguish one element from another. For example, a first contact could be termed a second contact, and, similarly, a second contact could be termed a first contact, without departing from the intended scope. The first contact and the second contact are both contacts, but they are not the same contact.

The terminology used in the description herein is for the purpose of describing particular embodiments only and is not intended to be limiting. As used in the description and the appended claims, the singular forms "a", "an" and "the" are intended to include the plural forms as well, unless the context clearly indicates otherwise. It will also be understood that the term "and/or" as used herein refers to and encompasses any and all possible combinations of one or more of the associated listed items. It will be further understood that the terms "includes," "including," "comprises," and/or "comprising," when used in this specification, specify the presence of stated features, integers, steps, operations, elements, and/or components, but do not preclude the presence or addition of one or more other features, integers, steps, operations, elements, components, and/or groups thereof.

As used herein, the term "if" may be construed to mean "when" or "upon" or "in response to determining" or "in response to detecting," depending on the context. Similarly, the phrase "if it is determined" or "if [a stated condition or event] is detected" may be construed to mean "upon determining" or "in response to determining" or "upon detecting [the stated condition or event]" or "in response to detecting [the stated condition or event]," depending on the context.

DETAILED DESCRIPTION

Various embodiments described herein relate to techniques for making glass optical components. In some embodiments, a glass optical component may be formed from multiple discrete glass member components using one or more non-adhesive bonding processes. Here, the term "adhesive bonding process" may broadly refer to a process for bonding multiple glass member components using an adhesive material that essentially "glues" together the member components. Therefore, the adhesive bonding process generally introduce an intermediate adhesive bonding layer between the member components. By comparison, a "non-adhesive bonding process" may utilize a non-adhesive approach, such as a relatively high temperature, an external electric field, and/or a chemical reaction, to join glass member components. For instance, in a fusion bonding process, two glass member components may directly touch each other without an intermediate layer. The member components may be melted in a relatively high temperature (e.g., ~550 degrees Celsius or higher) such that the melted member components may flow and join each other. Next, the temperate may be lowered down, and the member components may solidify to form an integrated, single piece glass component. In another example, in an anodic bonding process, two glass member components may be affixed, with direct contact with each other, between positive and negative electrodes. At a relative high temperature (e.g., ~250 to 400 degrees Celsius), an external electric field may be applied to the two electrodes. The electric field may cause a diffusion of particles (e.g., ions) out of one member component to another to seal the two member components together. In still another example, in a reactive bonding process, highly reactive nanoscale multilayers may be applied between two member components. The multilayers may include multiple alternating different thin metallic films. The self-propagating exothermic reaction in the multilayers may create local heat to bond the member components together. In some embodiments, the glass optical component formed from discrete member component with a non-adhesive bonding process may be part of a mobile multipurpose device, a camera, a head-mounted device, and the like.

Unlike a traditional adhesive bonding process, the non-adhesive glass-to-glass bonding process provides several benefits. One, it does not rely on an intermediate adhesive layer to provide the bonding power, thus reducing gaps or voids between member components and improving the bonding quality. In addition, in some embodiments, a coating may be applied, e.g., in a backfill process, to at least one of the member component before the non-adhesive bonding process to improve bonding performance. For instance, a silicon oxide (e.g., $SiO2$) coating may be added to surface(s) of a first member component using physical vapor deposition (PVD) such as sputtering or chemical vapor deposition (CVD) process. Unlike an adhesive layer, the silicon oxide coating may be polished to reach a substantially uniform layer thickness, e.g., with variation of several hundred nanometers or less. This can reduce heterogenous light transmission across member components within the formed optical component and thus improve its optical performance. Besides silicon oxide, a variety of other materials may also be used in the backfill-and-polish process. For instance, in some embodiments, graded materials using low and high refractive index materials, (e.g., a mixture of a low index material such as silicon oxide (e.g., $SiO2$) and a high index material such as titanium oxide (e.g., $TiO2$) or niobium oxide (e.g., $Nb2O5$)) may be used to tailor the optical properties with a graded index or different refractive index, and the bonding properties at the interface may also be adjusted by depositing materials such as barium oxide (e.g., BaO), sodium fluoride (NaF), and/or aluminum oxide (e.g., $Al2O3$) amongst others.

In addition, in some embodiments, the optical component may include one or more masks embedded within the optical component. In some embodiments, the masks may include a mask in a dark color (e.g., black) to block transmission of stray light from an environment in to and/or within the optical component to reduce flare. In some embodiments, the embedded masks may be created using a physical vapor deposition (PVD) process. For instance, a black coating material may be vaporized and deposited on to a surface of a first member component to form a thin film of the dark material. Next, the first member component may be bonded with a second member component at the surface of the first member component, e.g., using a non-adhesive bonding process, such that the black mask may be embedded between the two member components. Besides PVD, the black coating materials may also be deposited using other deposition methods such as chemical vapor deposition (CVD) or atomic layer deposition (ALD). Alternatively, in some embodiments, the embedded masks may be generated using a printing-and-sintering process. For instance, black glass frit may be screen-printed or digital-printed on to a surface of a first member component, which may be further sintered to seal the black coating to the member component. Next, the first member component may be joined with a second member component in a non-adhesive bonding process to form the optical component with an embedded black mask. In addition, in some embodiments, the optical component may include anti-reflective (AR) and/or high-reflective (HR) coating at one or more exterior surfaces of the optical component. The AR and/or HR coating may further reduce glare and/or protect the optical component against scratches and smudges. In some embodiments, the optical component may include additional dark masks, e.g., black masks, at one or more exterior surfaces of the optical component. For instance, in some embodiments, the additional black masks may be applied on top of the AR or HR coating to further reduce flare.

In some embodiments, the above-described bonding and/ or mask creation processes may be implemented on a glass wafer level. For instance, the PVD and/or printing-and-sintering processes may be performed on a first glass wafer (e.g., a first glass member component) to form a thin film of black coating at a surface of the first glass wafer. Next, one or more additional glass wafers (e.g., one or more additional member glass components) may be bonded to the first glass wafer using a non-adhesive bonding process to form an embedded mask between the member components. Then, the joined glass wafers altogether, as a single rigid body, may be cut into multiple pieces (also referred to as a "die" in this disclosure), where each piece may correspond to one optical component. The individual dice or optical components may be further processed to add additional external coating or masks (e.g., the outer black masks), as needed. The glass wafer level implementation may allow for making a plurality of glass optical components from discrete member components at a same time, thus greatly improving production efficiency.

Figure 1B:
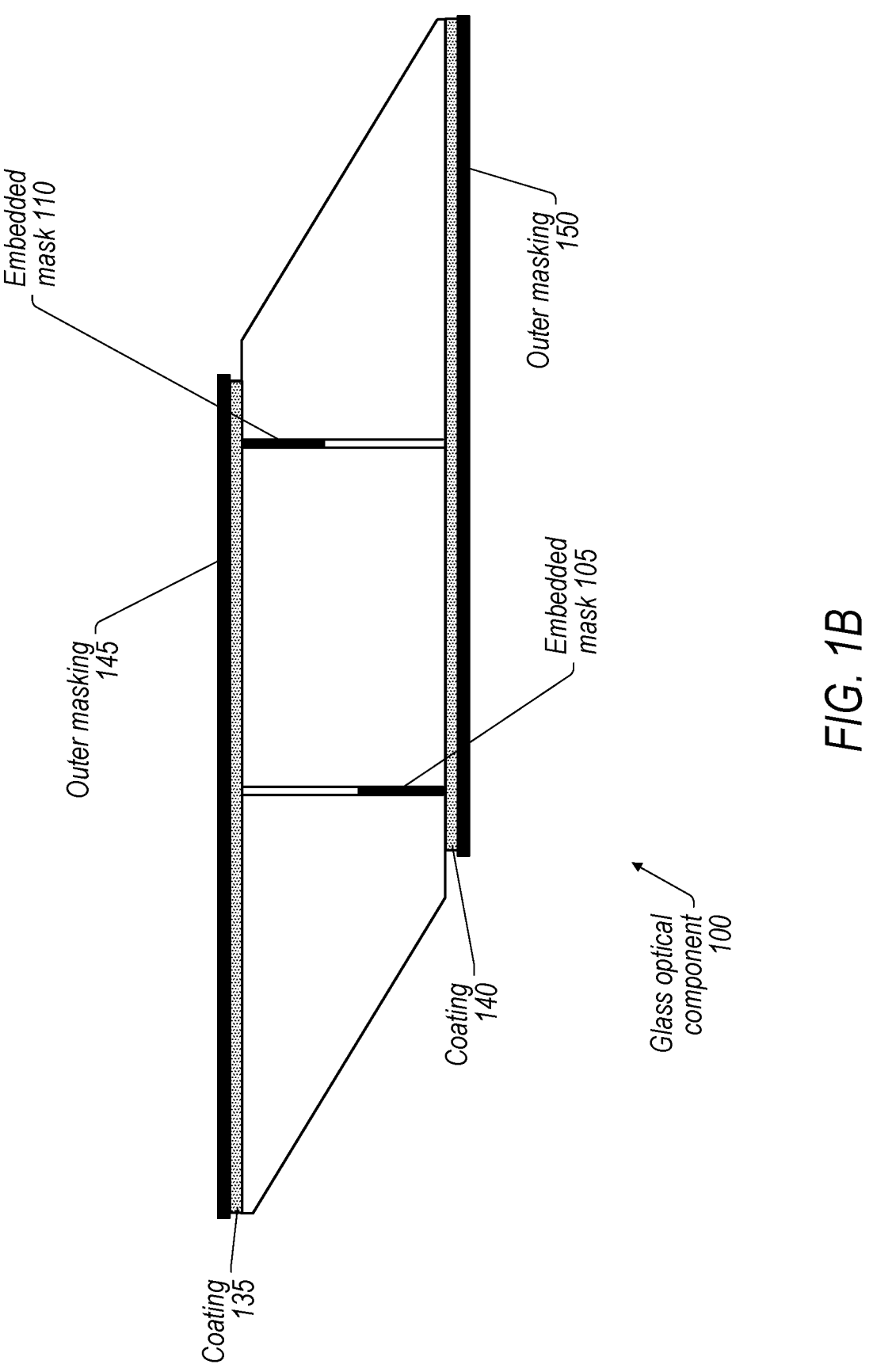

FIGS. 1A-1B show an example glass optical component with embedded mask, according to some embodiments. For purposes of illustration, only relevant components are shown in these figures. In this example, as shown in FIG. 1A, glass optical component 100 may be a glass prism in a parallelogrammatic shape with four surfaces, where a first surface S1 is parallel to a third surface S3, a second surface S2 is parallel to a fourth surface S4, and an angle between the first surface S1 and second surface S2 is an acute angle. Glass optical component 100 may include various types of glass components, such as silicon-oxide-based glass, aluminosilcate glass, or other type of alkali glass that could be ion exchanged to increase glass strength and/or non-silicon-based glass component (e.g., chalcogenide glass, silicon, and others). In some embodiments, optical component 100 may operate as a light folding element as part of an optical system to change the light transmission direction. For instance, as indicated by light path 130, in some embodiments, light may pass through the first surface S1 of optical component 100 to enter optical component 100. At least some of the light may arrive at the second surface S2 of optical component 100. When the incident angle of the light is close to or greater than a critical angle at the second surface S2 of optical component 100, total internal reflection (TIR) may occur and the light may be reflected at the second surface S2—e.g., the light being folded once. At least some of the light reflected from the second surface S2 may bounce back to the first surface S1 of optical component 100. Similarly, when the incident angle of the light is close to or greater than a critical angle at the first surface S1 of optical component 100, TIR may occur and the light may be reflected at the first surface S1—e.g., the light being folded twice. Next, at least some of the light reflected from the first surface S1 may transmit to and become reflected at the third surface prism S3 of optical component 100—e.g., the light being folded three times. Finally, at least some of the light reflected from the third surface S3 of optical component 100 may reach the fourth surface S4 of optical component 100, get reflected at the fourth surface S4 to the third surface S3, and exit optical component 100—e.g., the light being folded four times. Therefore, in this example, at least some light may be folded by optical component 100 four times to pass through optical component 100.

In some embodiments, optical component 100 may include one or more embedded masks 105 and/or 110. In some embodiments, embedded masks 105 and/or 110 may have a dark color, e.g., a black color, as shown in FIG. 1A.

Embedded masks 105 and/or 110 may be used to reduce flare. For an optical system, flare may occur when stray light from an external environment enters the optical system, especially stray light brighter than light from a scene or subject that a camera is supposed to capture. Flare can produce undesirable visual artifacts and thus negatively affect the image quality. The purpose of embedded masks 105 and/or 110 is to cover the areas supposedly to be hit by the stray light. This way, embedded masks 105 and/or 110 may intercept and absorb the stray light and thus reduce the flare. Note that FIG. 1A is only provided as an example for purposes of illustration. Optical component 100 is not limited to a specific geometry and instead may have a variety of shapes (e.g., triangle, rectangle, parallelogram, and so on). In addition, embedded masks 105 and/or 110 are not limited to a specific pattern or color either.

In some embodiments, optical component 100 may include anti-reflective (AR) or high-reflective (HR) coating at one or more exterior surfaces of optical component 100. For instance, in the cross-section view in FIG. 1B, glass optical component 100 may include coating 135 and 140 at the first surface S1 and third surface S3, respectively. In some embodiments, coating 135 and/or 140 may include an AR coating, a HR coating, or both (e.g., a multilayer coating having one type of coating overlapping another). Coating 135 and 140 may improve the light folding at the corresponding surfaces of optical component 100. In some embodiments, optical component 100 may further include outer masks at one or more exterior surfaces of optical component 100. In this example, outer black masks 145 and 150 may respectively be applied on top of coating 135 and 140 to further reduce flare for optical component 100. Note that FIG. 1B is an example for purposes of illustration. Note that the AR/HR coating and outer masks may or may not necessarily cover an entire area of a corresponding surface. For instance, in some embodiments, coating 135 may cover a partial or entire area of the first surface S1, whilst outer masking 145 may overlap partially or entirely coating 135 at the first surface S1.

Figure 2:
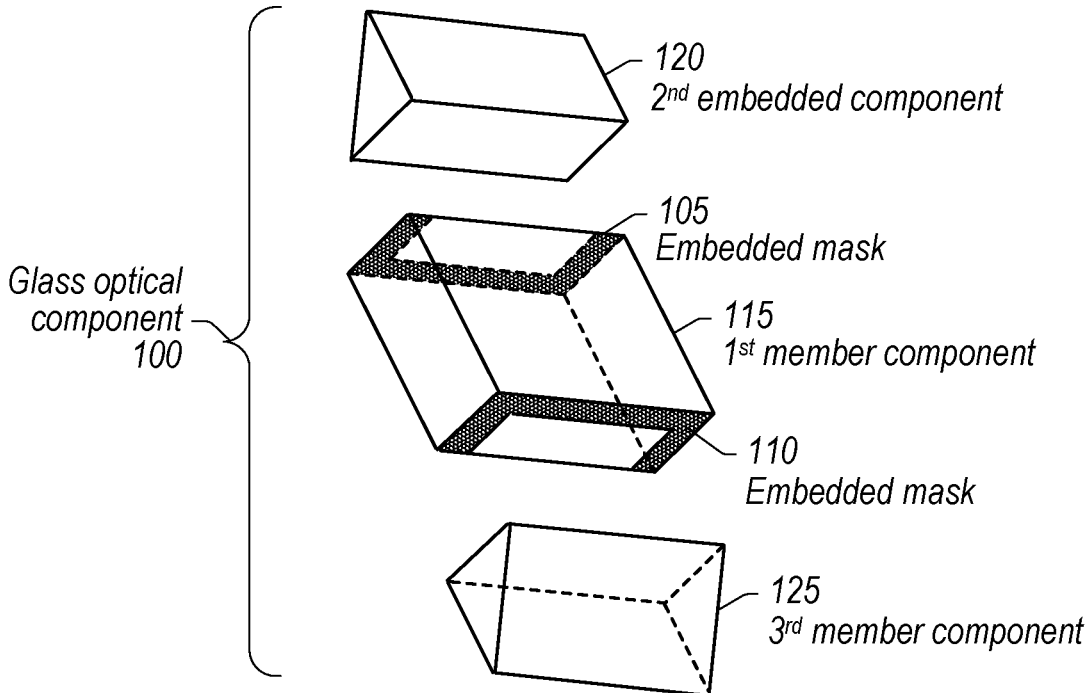
FIG. 2 shows an example glass optical component formed with multiple member components, according to some embodiments.

In some embodiments, an optical component may be formed by bonding multiple discrete member components. FIG. 2 shows an example glass optical component formed with multiple member components, according to some embodiments. In FIG. 2, optical component 100 may be formed by joining a first member component 115, a second member component 120, and a third member component 125. In this example, the first member component 115 may be a rectangular glass prism, whilst the second member component 120 and third member component 125 may each include a triangular glass prism. In some embodiments, black masks 105 and/or 110 may be first created at the surfaces of the first member component 115, e.g., using a PVD (CVD, ALD, or other processes as described above) or a printing-and-sintering process. Next, the first member component 115 may be bonded with the second member component 120 and the third member component 125 using a non-adhesive bonding process. As a result, black masks 105 and 110 may be embedded between (1) the first member component 115 and the second member component 120 and (2) the first member component 115 and the third member component 125, respectively.

Figure 3:
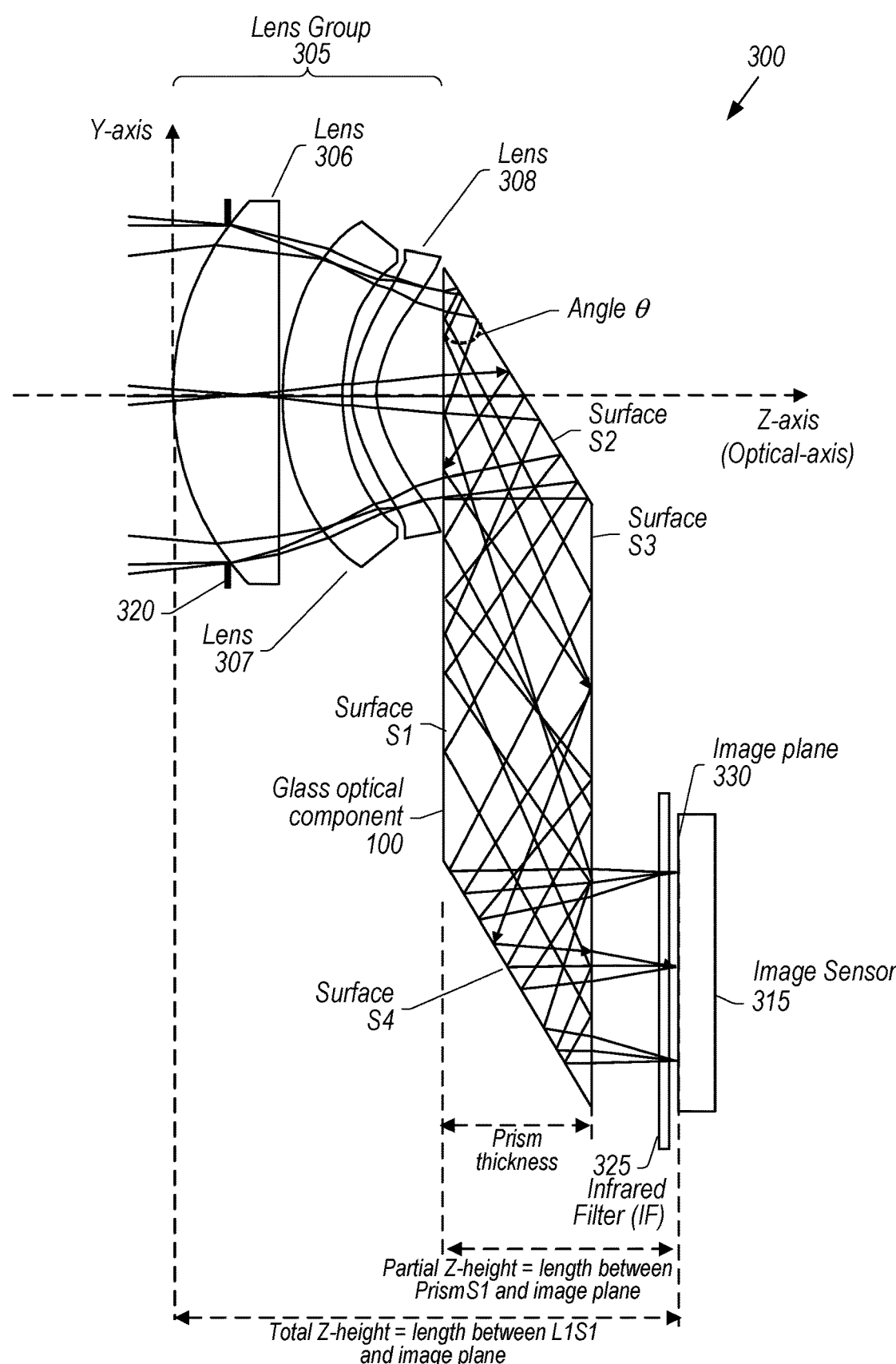
FIG. 3 shows an example optical system including a glass optical component, according to some embodiments.

FIG. 3 shows an example optical system including a glass optical component, according to some embodiments. In this example, optical system 300 may include lens group 305, optical component 100, and image sensor 315. FIG. 3 also illustrates a global optical coordinate system defined by Z-axis, Y-axis, and X-axis, where Z-axis corresponds to an optical axis of lens group 305 and X-Y axes are orthogonal to Z-axis. In some embodiments, lens group 305 may include one or more lenses, e.g., lens 306, 307 and 308, as shown in FIG. 3. In some embodiments, optical system 300 may include aperture stop 320 which may limit and control the amount of light entering or captured by lens group 305. In some embodiments, optical system 300 may optionally include infrared cut off filter (IRCF) 325 that may block or prevent at least some infrared light from reaching image sensor 315.

In some embodiments, as shown in FIG. 3, optical system 300 may include glass optical component 100 arranged, optically, between lens group 305 and image sensor 315 along the optical transmitting path of light from lens group 305 to image sensor 315. In some embodiments, optical component 100 may include multiple surfaces. For instance, as shown in FIG. 3, optical component 100 may include a parallelogram shaped prism, where a first surface S1 of optical component 100 is parallel to a third surface S3 of optical component 100, a second surface S2 of optical component 100 is parallel to a fourth surface S4 of optical component 100, and an angle θ between the first surface S1 and second surface S2 is an acute angle. In some embodiments, optical component 100 may be arranged such that the first surface S1 may face lens group 305, whilst the third surface S3 may face image sensor 315. However, the spatial arrangement of a single element light folding prism with respect to the lens group and image sensor within an optical system may vary from embodiment to embodiment.

As described above, optical component 100 may fold and change the light transmission direction. For instance, in FIG. 3, light from lens group 305 may pass through the first surface S1 of optical component 100 to enter optical component 100. At least some of the light may arrive at and then get reflected at the second surface S2 of optical component 100, as indicated by the edge in FIG. 3 (e.g., the light being folded once). At least some of the light reflected from the second surface S2 of optical component 100 may bounce back to the first surface S1 of optical component 100, as indicated by the edge in FIG. 3. When the incident angle of the light is close to or greater than the critical angle of optical component 100, the light may be reflected at the first surface S1 of optical component 100 under TIR (e.g., the light being folded twice). Next, at least some of the light reflected from the first surface S1 may transmit to and become reflected at the third surface prism S3 of optical component 100 (e.g., the light being folded three times). Finally, at least some of the light reflected from the third surface S3 of optical component 100 may reach the fourth surface S4 of optical component 100, get reflected at the fourth surface S4, and exit optical component 100 from the third surface S3 to focus on an image plane on image sensor 315 (e.g., the light being folded four times). Therefore, in this example of FIG. 3, at least some light passing through lens group 305 may be folded four times within optical component 100 before it exits optical component 100 to image sensor 315. The light folding of optical component 100 may effectively increase the focal length between lens group 305 and image sensor 315 of optical system 300, thus improving the magnification factor for optical system 300.

FIG. 4 shows a high-level flowchart of an example method for capturing images using an optical system including a glass optical system, according to some embodiments. As shown in FIG. 4, in some embodiments, one or more lenses (e.g., lenses 306, 307, and 308 in FIG. 3) of an optical system (e.g., optical system 300 in FIG. 3) may receive light from a scene or subject in an environment, as indicated by block 405. In some embodiments, the optical system may include a light folding prism (e.g., optical component 100 in FIG. 3) which may be arrange optically between the one or more lenses and an image sensor (e.g., image sensor 315) of the optical system. For instance, the prism may include at least four surfaces (e.g., surfaces S1, S2, S3, and S4) which may fold light within the prism at least four times to guide the light passing through the prism from the one or more lenses to the image sensor.

As described above, in some embodiments, the light captured by the one or more lenses may pass through a first surface (e.g., surface S1) of the prism to enter the prism, as indicated by block 410. In some embodiments, at least some of the light passing through the first surface may arrive at a second surface (e.g., surface S2) of the prism and may be reflected at the second surface, as indicated by block 415. In some embodiments, at least some of the light reflected from the second surface may bounce back to the first surface. As described above, when the incident angle of the light is close to or greater than a critical angle of the prism, TIR may occur and the light may be further reflected at the first surface of the prism, as indicated by block 420. In some embodiments, at least some of the light reflected from the first surface of the prism may transmit to and be reflected at a third surface (e.g., surface S3) of the prism, as indicated by block 425. Similarly, when the incident angle of the light is close to or greater than the critical angle, the light may be reflected at the third surface of the prism, as indicated by block 425. In some embodiments, at least some of the light reflected from the third surface may reach and get reflected at a fourth surface (e.g., surface S4) of the prism to exit the prism to the image sensor, as indicated by block 430. In some embodiments, the image sensor may detect the light and accordingly generate image signals, e.g., electrical signals, from which images may be created, as indicated by block 435.

Figure 5B:
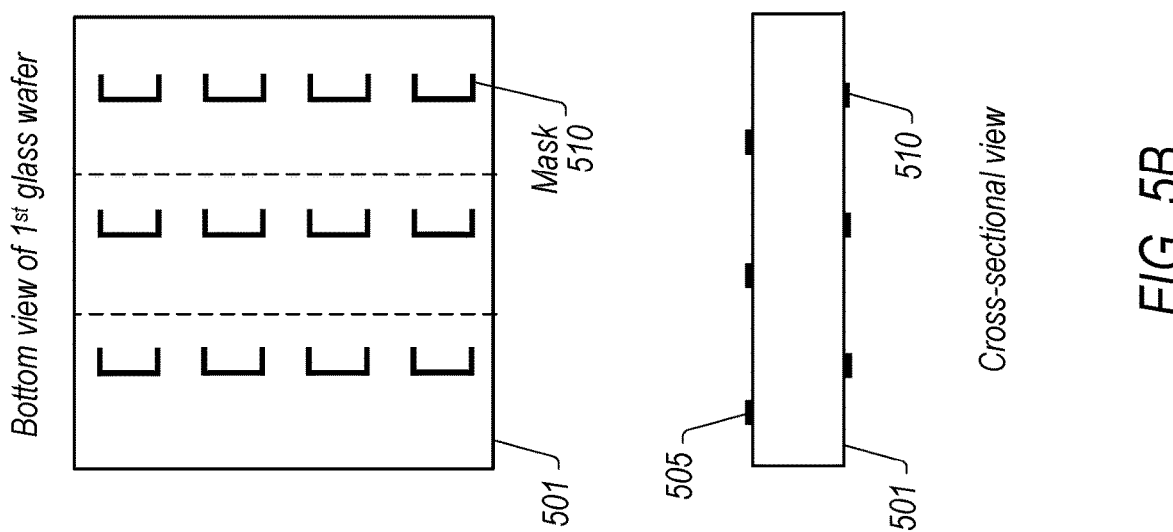
FIGS. 5A-5K show an example process for making a glass optical component with embedded mask from discrete member components, according to some embodiments.
Figure 5A:
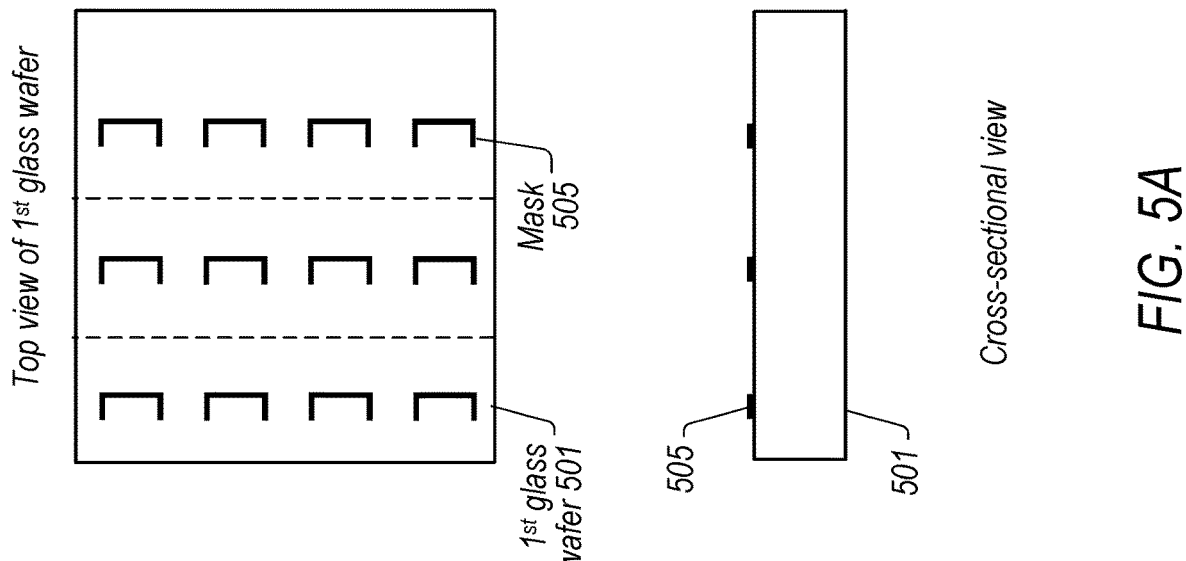

FIGS. 5A-5K show an example process for making a glass optical component with embedded mask from discrete member components, according to some embodiments. As indicated in the figures, this example process may be implemented on a glass wafer level. As described above, the glass wafer may include various types of glass wafer, such as silicon-based (e.g., SiO2 glass wafer) and/or non-silicon-based materials (e.g., chalcogenide glass wafer, aluminosilicate glass wafer, and others). For instance, in the top, bottom, and cross-sectional views in FIGS. 5A-5B, in some embodiments, dark masks (e.g., black masks) 505 and 510 may be created at the top and bottom surfaces of a first glass wafer 501 (e.g., the first member glass component). In some embodiments, masks 505 and 510 may be created using a PVD process. For instance, a black coating material (e.g., titanium oxide TiO2, mixed metal oxides, metals, metal nitrides, carbide or other material known in the PVD field used in dark coating) may be vaporized and deposited to the top and bottom surfaces of the first glass wafer 501 to form a thin film of the dark material. The PVD process can be controlled to allow for forming masks 505 and 510 in various patterns and/or thickness. Further, as described above, in some embodiments, the black coating materials may be deposited using other approaches such as CVD or ALD. Alternatively, in some embodiments, masks 505 and 510 may be created using a printing-and-sintering process. For instance, black glass frit may be screen-printed or digital-printed on to the top and bottom surfaces of the first glass wafer 501. In screen-printing, a metal mesh (e.g., a stainless-steel mesh) or a non-metal mesh (e.g., a silk mesh) having a pattern for masks 505 and/or 510 may be placed over the first glass wafer 501. The pattern on the mesh may be generated ahead of time using a lithography-like or any other known process. Next, black ink may be applied to the top and bottom surfaces of the first glass wafer 501, through the overlapping mesh, to create masks 505 and 510 in the designed pattern. By comparison, in digital-printing, an inkjet printer may be used to print masks 505 and 510 directly on to the top and bottom surfaces of the first glass wafer 501. Once masks 505 and 510 are printed on to the first glass wafer 501, the first glass wafer 501 may be sintered or "hot baked" (e.g., using a thermal or laser process) to seal masks 505 and 510 to the first glass wafer 501. As shown in FIGS. 5A-5B, a plurality of masks 505 and 510 may be created on the first glass wafer 501 at a same time, such that multiple optical components (e.g., multiple optical component 100) may be formed from one flow of the example process at a same time.

Figures 5C, 5D:
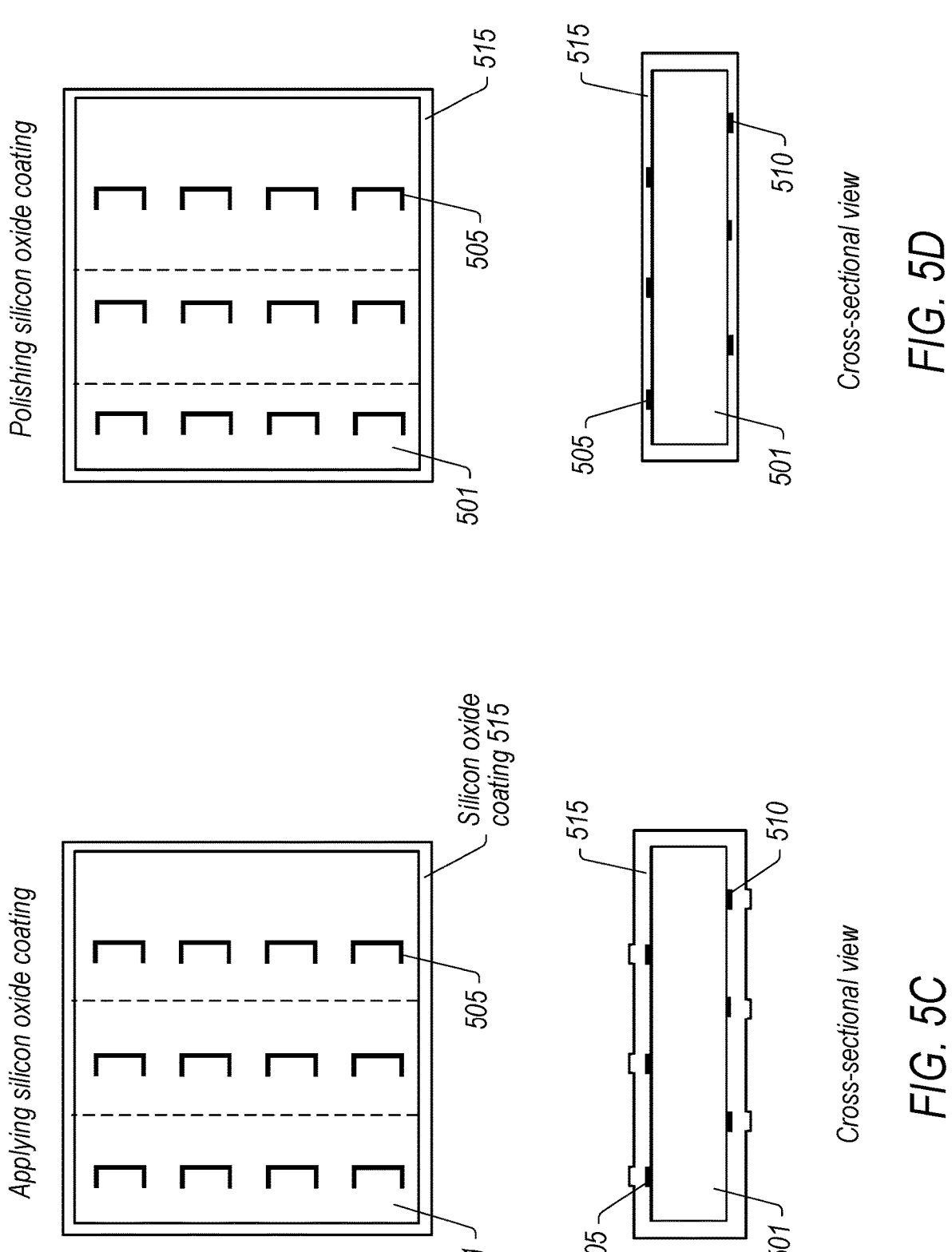

In FIG. 5C, in some embodiments, a backfill process may be performed where silicon oxide (e.g., SiO2) coating may be applied to one or more surfaces of the first glass wafer 501 to improve performance of subsequent glass-to-glass bonding. For example, silicon oxide coating 515 may be applied at the top and bottom surfaces of the first glass wafer 501 using a CVD process. For instance, the first glass wafer 501 may be exposed to one or more appropriate volatile precursors that react and/or decompose on the surfaces of the first glass wafer 501 to produce the silicon oxide deposit. As described above, alternatively, other materials may also be used in the backfill process, such as graded materials (e.g., SiO2/TiO2 mixture, SiO2/Nb2O5 mixture, etc.), barium oxide (e.g., BaO), sodium fluoride (NaF), or aluminum oxide (e.g., $Al_2O_3$). Further, the backfill coating may be performed using a PVD process such as sputtering as an alternative to CVD. In some embodiments, a pre-activation process may be further performed prior to the backfill process. For instance, plasma, chemical absorption, or deposition of a reactive component or terminal group by surface functionalization may be added as a way to further improve performance of the following bonding process between the member components.

Next, in FIG. 5D, in some embodiments, silicon oxide coating 515 may be polished to a substantially uniform thickness (e.g., with variation of several hundred nanometers and less). The polishing may be implemented with a mechanical polishing (e.g., mechanical lapping) or a chemical-mechanical polishing (CMP) process.

Figures 5E, 5F:
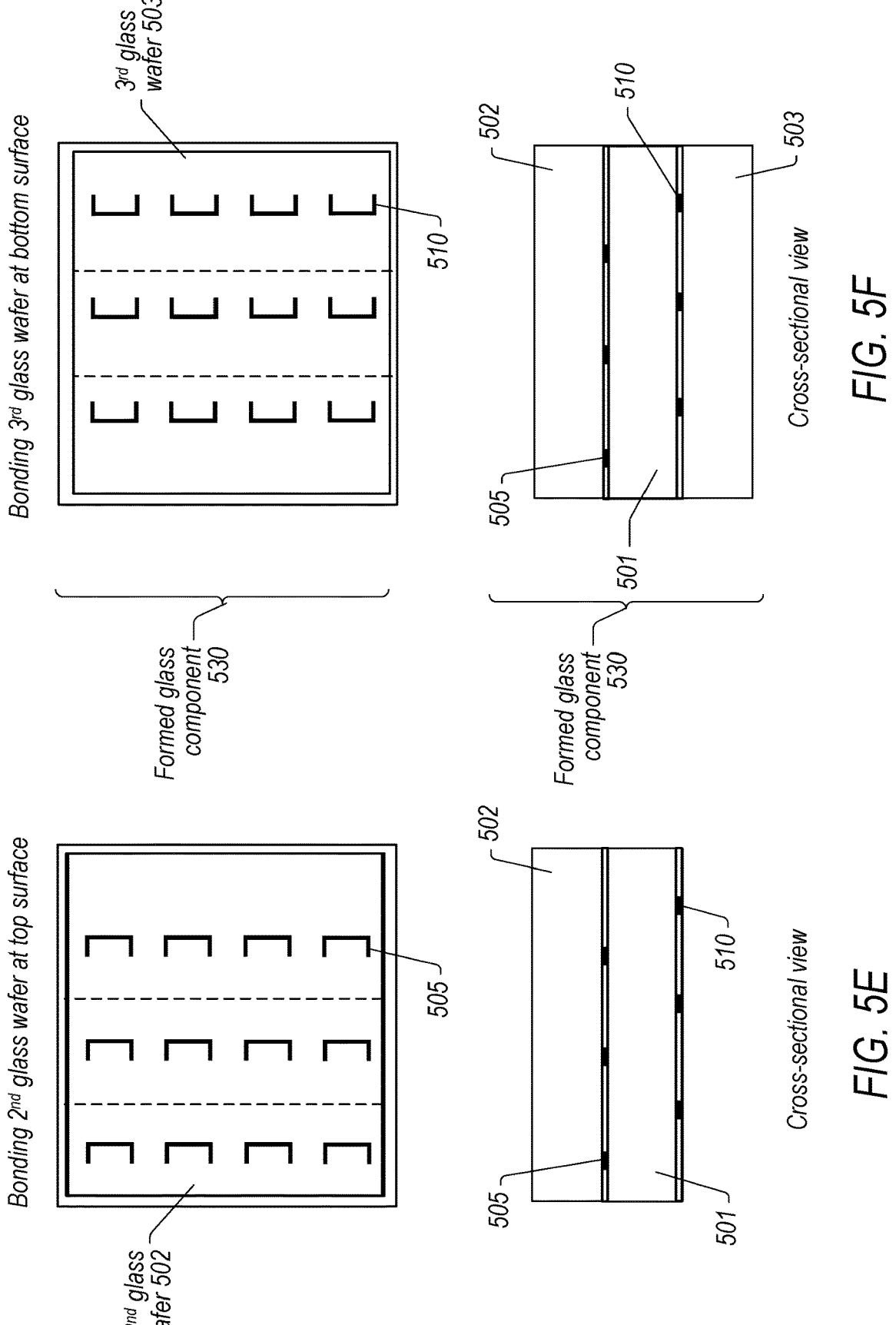

In FIGS. 5E-5F, in some embodiments, additional glass wafers 502 and 503 may be bonded to the first glass wafer 501 at the top and bottom surfaces of the first glass wafer 501, such that masks 505 and 510 may be embedded between (1) the first glass wafer 501 and the second glass wafer 502 and/or (2) the first glass wafer 501 and the third glass wafer 503, respectively. In some embodiments, the glass-to-glass bonding between these glass wafers may be performed with a non-adhesive bonding process, such as a fusion bonding process, an anodic bonding process, a reactive bonding process, or other non-adhesive bonding process. For instance, in a fusion bonding process, glass wafers 501, 502, and 503 may be melted in a relatively high temperature such that the melted glass wafers 501, 502, and 503 may flow and join each other. Next, the melted glass wafers 501, 502, and 503 may solidify in a lowered temperature to form a single piece formed glass component 530. In another example, in an anodic bonding process, glass wafers 501 and 502, and glass wafers 501 and 503, may be placed between two electrodes. At a relative high temperature, an external electric field may be applied to the electrodes to cause a diffusion of particles from one glass wafer to another to seal the two glass wafers together. In still another example, in a reactive bonding process, highly reactive nanoscale multilayers may be applied between glass wafers 501, 502, and 503. The multilayers may include multiple alternating different thin metallic films that can undergo a chemical reaction to generate local heat to bond glass wafer 501 with glass wafers 502 and 503. As shown in FIGS. 5E-5F, after the joining of glass wafers 501, 502, and 503, masks 505 and 510 may become embedded inside formed glass component 530.

Figure 5H:
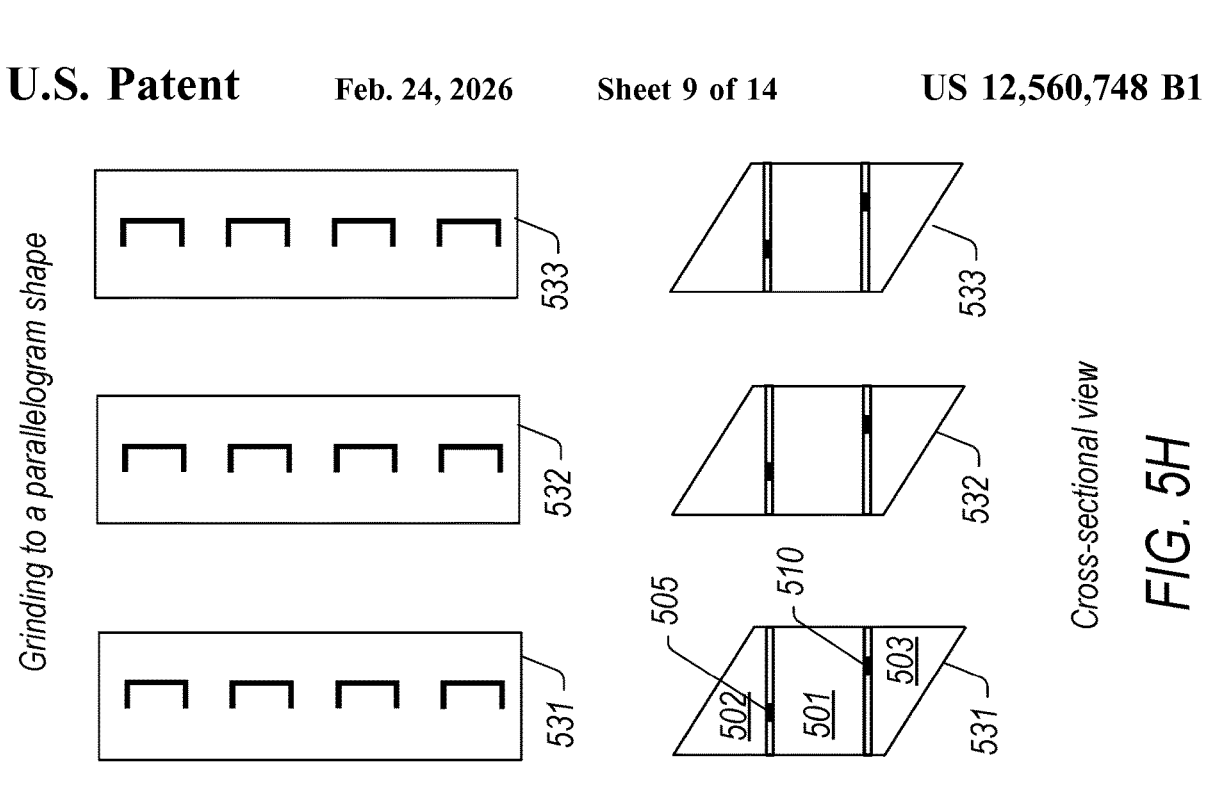
Figure 5G:
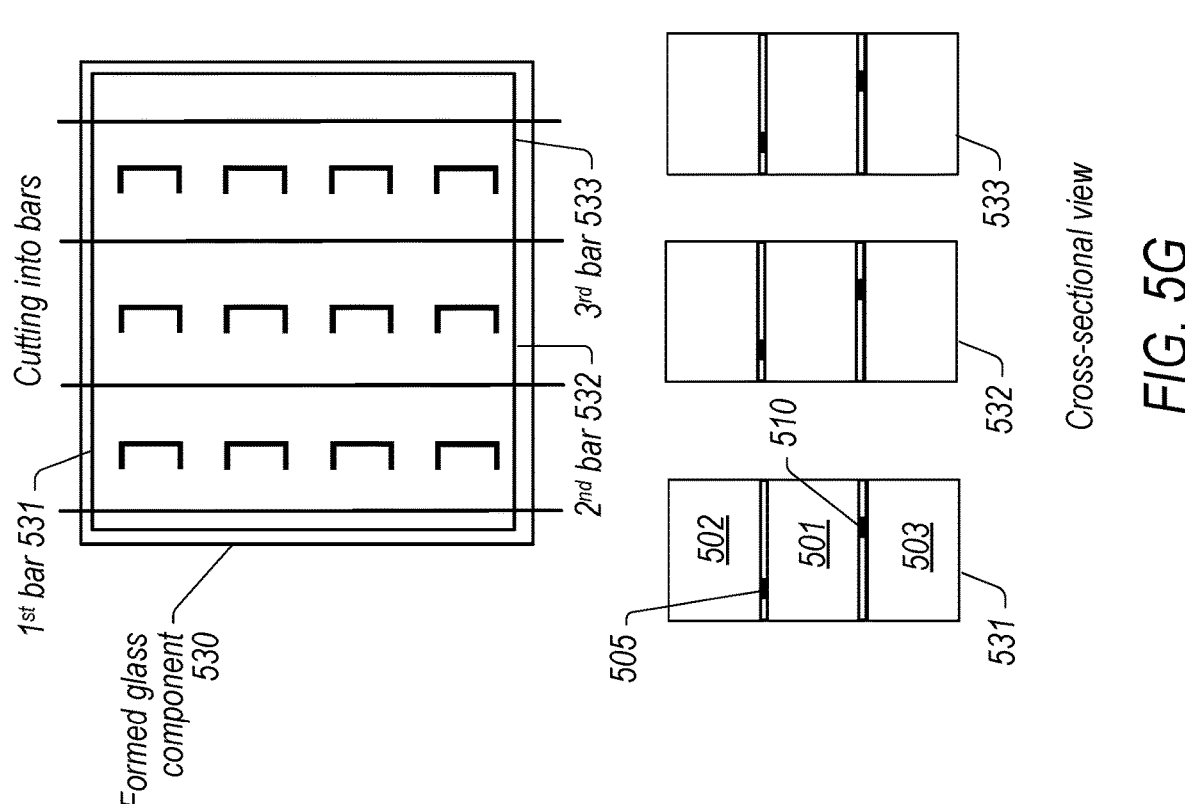

As indicated in FIG. 5G, in some embodiments, formed glass component 530 may be divided into multiple bars 531, 532, and 533, e.g., using mechanical or laser cutting processes. As a result, bars 531, 532, and 533 may individually include a part of the bonded glass wafers 501, 502, and 503, as well as embedded masks 505 and 510.

In FIG. 5H, in some embodiments, bars 531, 532, and 533 may be cut in to a specific geometry. In this example, bars 531, 532, and 533 may individually be re-formed into a parallelogram shape like optical component 100 in FIGS. 1-4. The cut may be implemented using any of various suitable methods, such as grinding polishing, laser cutting, laser etching, blade dicing, dicing saw, CNC machining, wire cutting, sand blasting, and/or any of various common methods to trim.

Figures 5I, 5J, 5K:
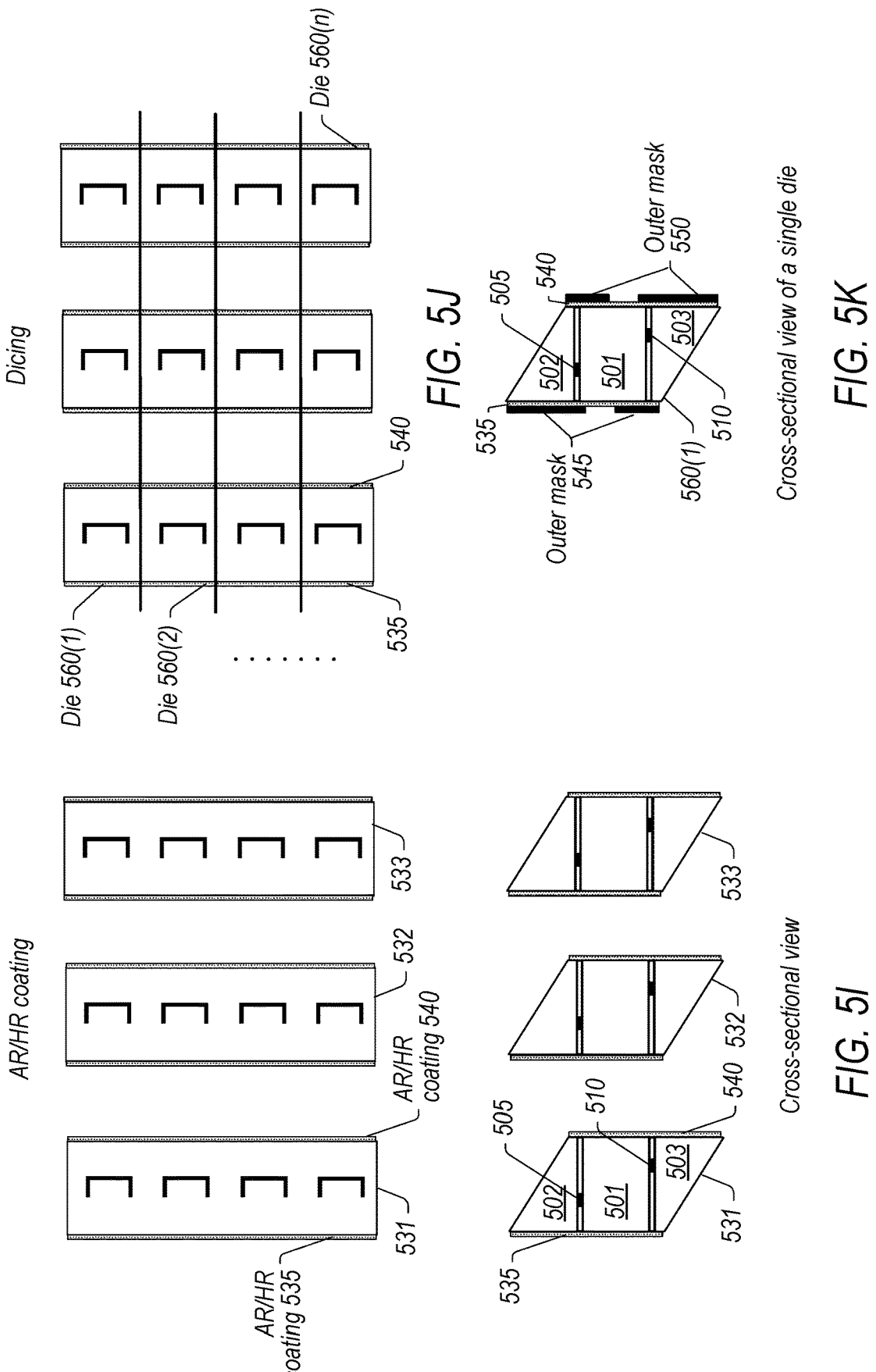

In FIG. 5I, in some embodiments, additional AR and/or HR may be applied to one or more exterior surfaces of glass bar 531, 532, and 533. For instance, in this example, AR and/or HR coating 135 and 140 may be applied to the two side surfaces of bars 531, 532, and 533.

In FIG. 5J, bars 531, 532, and 533 may be further cut into multiple pieces or dies 560(1), 560(2), . . . , 560(n), e.g., using mechanical or laser cutting processes. As shown in FIG. 5J, each die 560 may correspond to a parallelogram-shaped glass optical component with embedded masks 505 and 510 (e.g., like optical component 100).

In FIG. 5K, in some embodiments, additional outer masks may be applied to one or more exterior surfaces of individual dice or optical components. For instance, black masks 545 and 550 may be applied to die or optical component 560(1) to overlap AR and/or HR coating 535 and 540, respectively, to further reduce flare. In this example, black masks 545 and 550 cover only a partial area of AR and/or HR coating 353 and 540. Black masks 545 and 550 may be created in one of various approaches, such as a PVD process, a printing-and-sintering process, or any other appropriate approaches.

FIG. 6 is a high-level flowchart showing an example method for making an optical component, according to some embodiments. In this example, in some embodiments, one or more masks (e.g., black masks) may be created at one or more surfaces of a first glass member component (e.g., a first glass wafer), as indicated in block 605. As described above, the masks may be created using one of various approaches, such as a PVD, CVD, or ALD process, a printing-and-sintering process, or any other appropriate approaches. In some embodiments, a backfill coating (e.g., SiO2 or other materials as described above) may be applied to and polished at one or more surfaces of the first member component to improve glass-to-glass bonding process, as indicated in block 610. As described, the silicon oxide coating may be applied using a CVD or PVD process, and then polished using a mechanical polishing or chemical-mechanical polishing (CMP) process. The first member component may be bonded with one or more additional glass member components (e.g., one or more additional glass wafers) to embed the one or more masks into the formed glass component, as indicated in block 615. As described above, the bonding may be implemented using one of various non-adhesive bonding process, e.g., a fusion bonding process, an anodic bonding process, a reactive bonding process, and so on.

In some embodiments, the joined member components may be cut into a plurality of glass bars, as indicated in block 620. The individual glass bars may be coated with AR and/or HR coating, as indicated in block 625. In some embodiments, the individual glass bars may be cut into a plurality of dice, where each die may correspond to the final optical component product, as indicated in block 630. In some embodiments, individual dice or optical components may be further coated with one or more outer masks (e.g., black masks), as indicated in block 635.

Figures 7A, 7B, 7C:
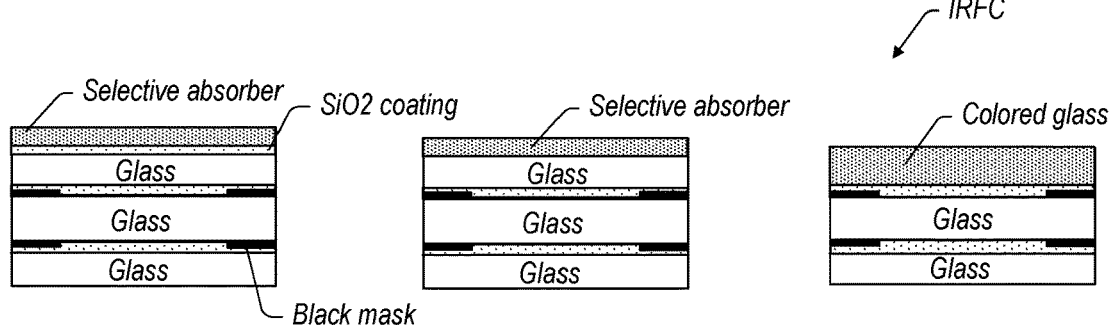
FIG. 7A-7G show additional examples for making optical components, according to some embodiments.
Figures 7D, 7E:
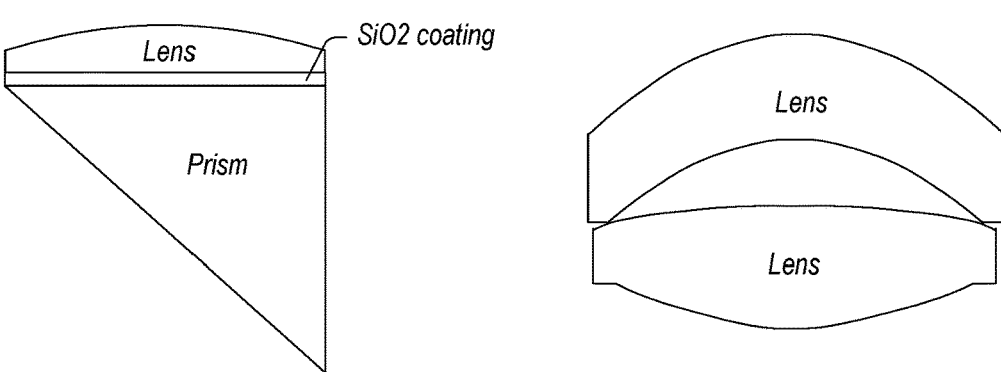
Figures 7F, 7G:
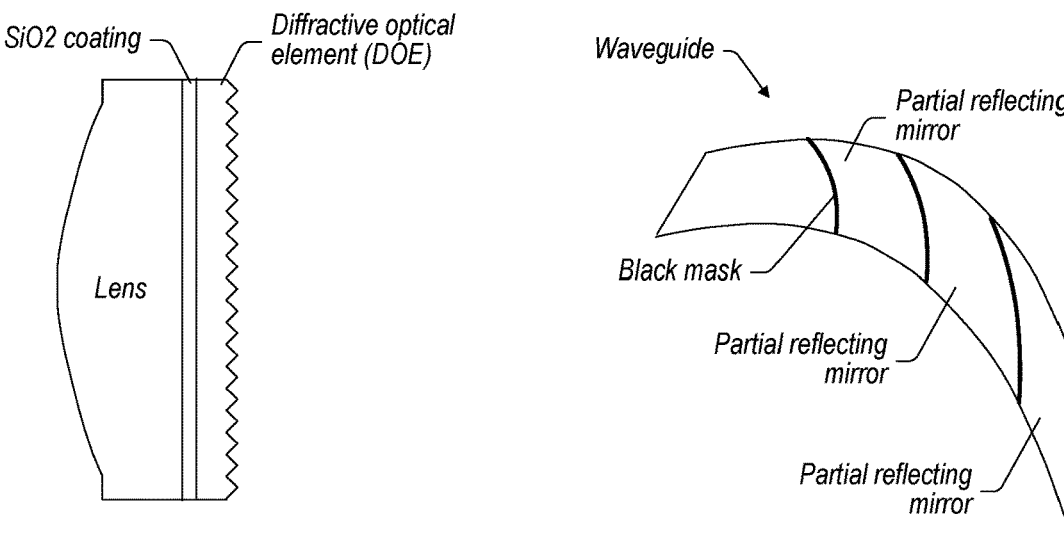

Note that FIGS. 1-6 are provided as only examples to illustrate the disclosed techniques for making a glass optical component with embedded mask from discrete member components. Besides light folding elements such as prisms, the disclosed techniques may be also used to make optical components for many other applications. For instance, in some embodiments, the disclosed techniques may be used to create a glass optical component with selective absorber, such as an IRCF (e.g., like IRCF 325 in FIG. 3). The IRCF may have multiple bonded glass layers, as shown in FIGS. 7A-7C, and include a selective absorber to filter out light of a specific wavelength (e.g., visible light, infrared (IR) or near IR light, ultraviolet (UV) or near UV light, or a specific portion of visible, IR, and/or UV light). The selective absorber may be formed at an exterior surface of the IRCF or embedded inside the IRCF like an embedded mask, e.g., by applying a coating of light absorbing material to a glass component with or without a backfill coating (e.g., a SiO2 coating), as shown in FIGS. 7A-7B. In addition, in some embodiments, the silicon oxide (e.g., SiO2) coating used for glass-to-glass bonding may be substituted with a graded film or mixture of metal oxides to create a graded index or different refractive index. Alternatively, as shown in FIG. 7C, an IRFC type glass (e.g., a colored glass) may be bonded directedly to another glass component, e.g., using one of the non-adhesive bonding techniques as described above to generate the IRFC. As indicated in FIGS. 7A-7C, the IRFC may further include one or more embedded masks, e.g., generated using the techniques disclosed herein. In another example, the disclosed techniques may be used to bond a glass lens with a glass prism, or bond multiple glass lenses, as indicated in FIGS. 7D-7E. For instance, multiple glass lenses, each with specific optical power, may be joined together using the disclosed non-adhesive bonding process to form a lens group. In still another example, the disclosed techniques may be used to bond glass lens(es), glass prism(s), glass diffractive optical element(s), glass waveguide(s), or other glass components. For instance, as indicated in FIG. 7F, the techniques disclosed herein may be used to join a lens with a diffractive optical element (DOE). Also, as indicated in FIG. 7G, the disclosed techniques may be used to form a waveguide where multiple partial reflecting mirrors or fractured mirrors may be bonded, e.g., cascaded in series, to create the waveguide that can guide light passing through the formed waveguide to a designed exit direction. In this example, one or more black masks may be also embedded inside the waveguide, and there may be a functional coating (e.g., on the mirror) or the black masks material may be replaced by a half mirror coating. The mirror coating reflectivity may be tuned for each layer of the waveguide as needed to achieve the intended optical performance.

Figure 8:
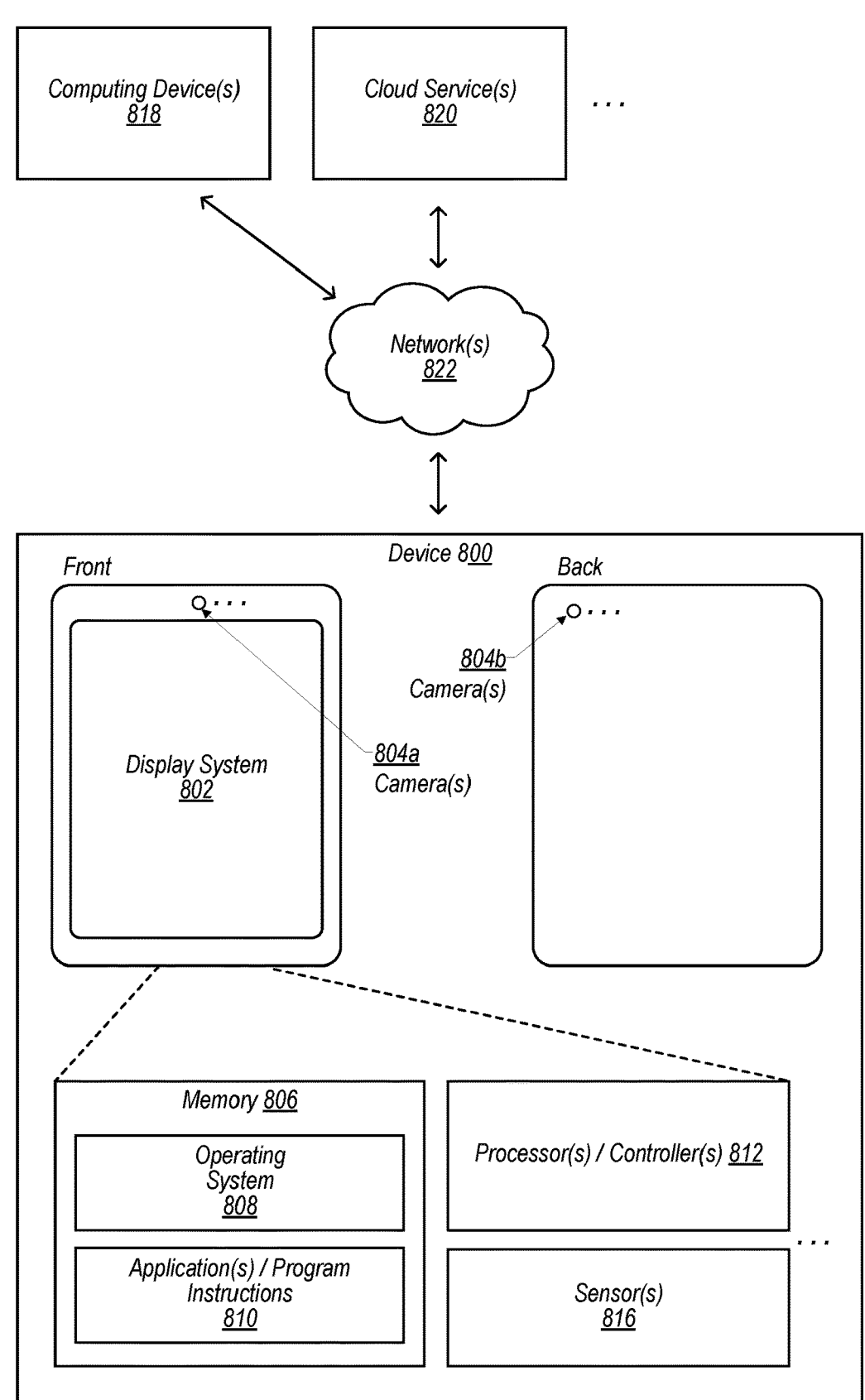
FIG. 8 illustrates a schematic representation of an example device that may include a glass optical component, according to some embodiments.

FIG. 8 illustrates a schematic representation of an example device 800 that may include a glass optical component, e.g., as described herein with reference to FIGS. 1-7, according to some embodiments. In some embodiments, the device 800 may be a mobile device and/or a multifunction device. In various embodiments, the device 800 may be any of various types of devices, including, but not limited to, a personal computer system, desktop computer, laptop, notebook, tablet, slate, pad, or netbook computer, mainframe computer system, handheld computer, workstation, network computer, a camera, a set top box, a mobile device, an augmented reality (AR) and/or virtual reality (VR) headset, a consumer device, video game console, handheld video game device, application server, storage device, a television, a video recording device, a peripheral device such as a switch, modem, router, or in general any type of computing or electronic device.

In some embodiments, the device 800 may include a display system 802 (e.g., comprising a display and/or a touch-sensitive surface) and/or one or more cameras 804. In some non-limiting embodiments, the display system 802 and/or one or more front-facing cameras 804*a* may be provided at a front side of the device 800, e.g., as indicated in FIG. 8. Additionally, or alternatively, one or more rear-facing cameras 804*b* may be provided at a rear side of the device 800. In some embodiments comprising multiple cameras 804, some or all of the cameras may be the same as, or similar to, each other. Additionally, or alternatively, some or all of the cameras may be different from each other. In various embodiments, the location(s) and/or arrangement(s) of the camera(s) 804 may be different than those indicated in FIG. 8.

Among other things, the device 800 may include memory 806 (e.g., comprising an operating system 808 and/or application(s)/program instructions 810), one or more processors and/or controllers 812 (e.g., comprising CPU(s), memory controller(s), display controller(s), and/or camera controller(s), etc.), and/or one or more sensors 816 (e.g., orientation sensor(s), proximity sensor(s), and/or position sensor(s), etc.). In some embodiments, the device 800 may communicate with one or more other devices and/or services, such as computing device(s) 818, cloud service(s) 820, etc., via one or more networks 822. For example, the device 800 may include a network interface (e.g., network interface 810) that enables the device 800 to transmit data to, and receive data from, the network(s) 822. Additionally, or alternatively, the device 800 may be capable of communicating with other devices via wireless communication using any of a variety of communications standards, protocols, and/or technologies.

Figure 9:
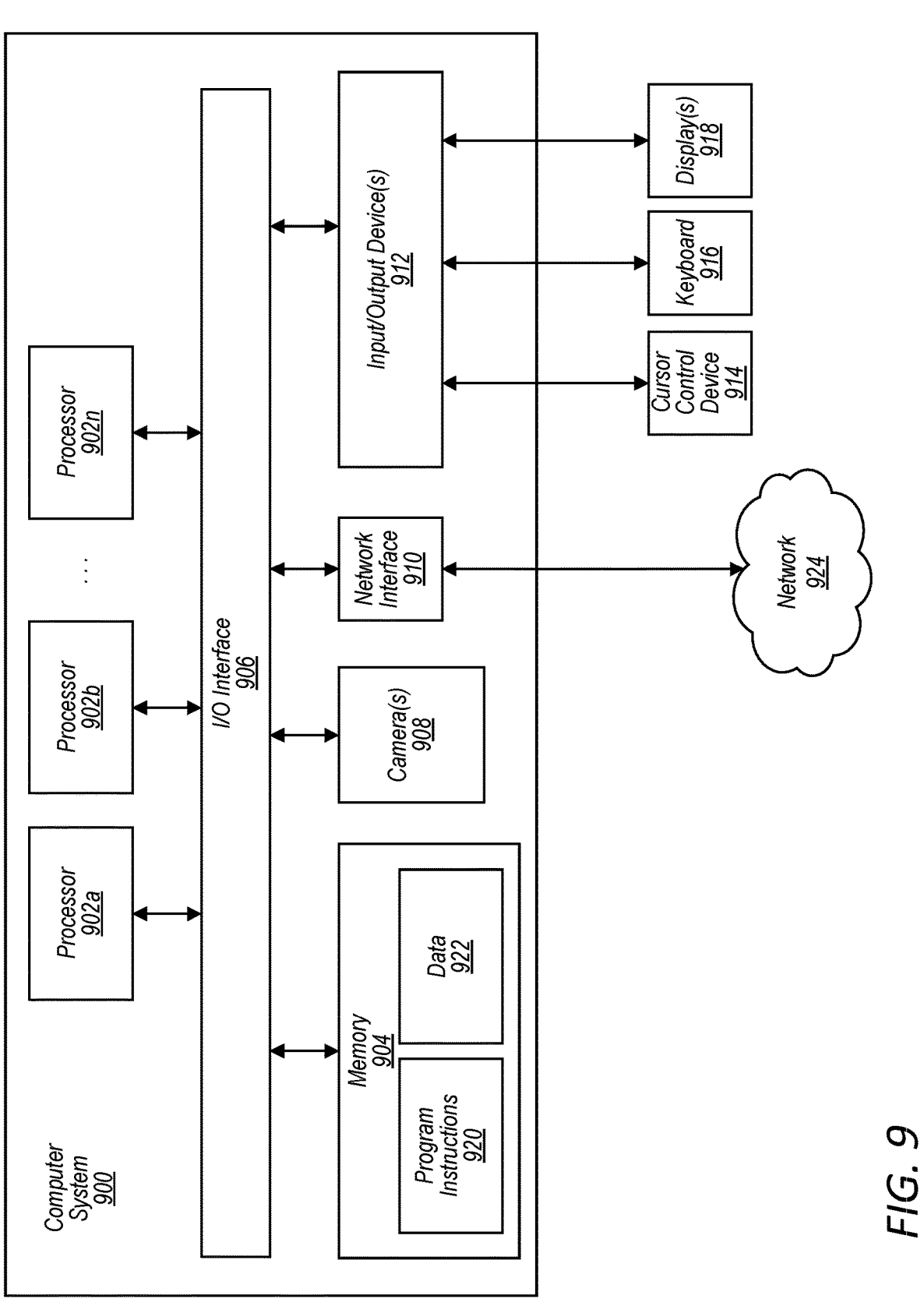
FIG. 9 illustrates a schematic block diagram of an example computer system that may include a glass optical component, according to some embodiments.

FIG. 9 illustrates a schematic block diagram of an example computing device, referred to as computer system 900, that may include or host embodiments of a computer device including a glass optical component, e.g., as described herein with reference to FIGS. 1-8, according to some embodiments. In addition, computer system 900 may implement methods for controlling operations of the camera and/or for performing image processing images captured with the camera. In some embodiments, the device 800 (described herein with reference to FIG. 8) may additionally, or alternatively, include some or all of the functional components of the computer system 900 described herein.

The computer system 900 may be configured to execute any or all of the embodiments described above. In different embodiments, computer system 900 may be any of various types of devices, including, but not limited to, a personal computer system, desktop computer, laptop, notebook, tablet, slate, pad, or netbook computer, mainframe computer system, handheld computer, workstation, network computer, a camera, a set top box, a mobile device, an augmented reality (AR) and/or virtual reality (VR) headset, a consumer device, video game console, handheld video game device, application server, storage device, a television, a video recording device, a peripheral device such as a switch, modem, router, or in general any type of computing or electronic device.

In the illustrated embodiment, computer system 900 includes one or more processors 902 coupled to a system memory 904 via an input/output (I/O) interface 906. Computer system 900 further includes one or more cameras 908 coupled to the I/O interface 906. Computer system 900 further includes a network interface 910 coupled to I/O interface 906, and one or more input/output devices 912, such as cursor control device 914, keyboard 916, and display(s) 918. In some cases, it is contemplated that embodiments may be implemented using a single instance of computer system 900, while in other embodiments multiple such systems, or multiple nodes making up computer system 900, may be configured to host different portions or instances of embodiments. For example, in one embodiment some elements may be implemented via one or more nodes of computer system 900 that are distinct from those nodes implementing other elements.

In various embodiments, computer system 900 may be a uniprocessor system including one processor 902, or a multiprocessor system including several processors 902 (e.g., two, four, eight, or another suitable number). Processors 902 may be any suitable processor capable of executing instructions. For example, in various embodiments processors 902 may be general-purpose or embedded processors implementing any of a variety of instruction set architectures (ISAs), such as the x86, PowerPC, SPARC, or MIPS ISAs, or any other suitable ISA. In multiprocessor systems, each of processors 902 may commonly, but not necessarily, implement the same ISA.

System memory 904 may be configured to store program instructions 920 accessible by processor 902. In various embodiments, system memory 904 may be implemented using any suitable memory technology, such as static random access memory (SRAM), synchronous dynamic RAM (SDRAM), nonvolatile/Flash-type memory, or any other type of memory. Additionally, existing camera control data 922 of memory 904 may include any of the information or data structures described above. In some embodiments, program instructions 920 and/or data 922 may be received, sent or stored upon different types of computer-accessible media or on similar media separate from system memory 904 or computer system 900. In various embodiments, some or all of the functionality described herein may be implemented via such a computer system 900.

In one embodiment, I/O interface 906 may be configured to coordinate I/O traffic between processor 902, system memory 904, and any peripheral devices in the device, including network interface 910 or other peripheral interfaces, such as input/output devices 912. In some embodiments, I/O interface 906 may perform any necessary protocol, timing or other data transformations to convert data signals from one component (e.g., system memory 904) into a format suitable for use by another component (e.g., processor 902). In some embodiments, I/O interface 906 may include support for devices attached through various types of peripheral buses, such as a variant of the Peripheral Component Interconnect (PCI) bus standard or the Universal Serial Bus (USB) standard, for example. In some embodiments, the function of I/O interface 906 may be split into two or more separate components, such as a north bridge and a south bridge, for example. Also, in some embodiments some or all of the functionality of I/O interface 906, such as an interface to system memory 904, may be incorporated directly into processor 902.

Network interface 910 may be configured to allow data to be exchanged between computer system 900 and other devices attached to a network 924 (e.g., carrier or agent devices) or between nodes of computer system 900. Network 924 may in various embodiments include one or more networks including but not limited to Local Area Networks (LANs) (e.g., an Ethernet or corporate network), Wide Area Networks (WANs) (e.g., the Internet), wireless data networks, some other electronic data network, or some combination thereof. In various embodiments, network interface 910 may support communication via wired or wireless general data networks, such as any suitable type of Ethernet network, for example; via telecommunications/telephony networks such as analog voice networks or digital fiber communications networks; via storage area networks such as Fibre Channel SANs, or via any other suitable type of network and/or protocol.

Input/output devices 912 may, in some embodiments, include one or more display terminals, keyboards, keypads, touchpads, scanning devices, voice or optical recognition devices, or any other devices suitable for entering or accessing data by one or more computer systems 900. Multiple input/output devices 912 may be present in computer system 900 or may be distributed on various nodes of computer system 900. In some embodiments, similar input/output devices may be separate from computer system 900 and may interact with one or more nodes of computer system 900 through a wired or wireless connection, such as over network interface 910.

Those skilled in the art will appreciate that computer system 900 is merely illustrative and is not intended to limit the scope of embodiments. In particular, the computer system and devices may include any combination of hardware or software that can perform the indicated functions, including computers, network devices, Internet appliances, PDAs, wireless phones, pagers, etc. Computer system 900 may also be connected to other devices that are not illustrated, or instead may operate as a stand-alone system. In addition, the functionality provided by the illustrated components may in some embodiments be combined in fewer components or distributed in additional components. Similarly, in some embodiments, the functionality of some of the illustrated components may not be provided and/or other additional functionality may be available.

Those skilled in the art will also appreciate that, while various items are illustrated as being stored in memory or on storage while being used, these items or portions of them may be transferred between memory and other storage devices for purposes of memory management and data integrity. Alternatively, in other embodiments some or all of the software components may execute in memory on another device and communicate with the illustrated computer system via inter-computer communication. Some or all of the system components or data structures may also be stored (e.g., as instructions or structured data) on a computer-accessible medium or a portable article to be read by an appropriate drive, various examples of which are described above. In some embodiments, instructions stored on a computer-accessible medium separate from computer system 900 may be transmitted to computer system 900 via transmission media or signals such as electrical, electromagnetic, or digital signals, conveyed via a communication medium such as a network and/or a wireless link. Various embodiments may further include receiving, sending or storing instructions and/or data implemented in accordance with the foregoing description upon a computer-accessible medium. Generally speaking, a computer-accessible medium may include a non-transitory, computer-readable storage medium or memory medium such as magnetic or optical media, e.g., disk or DVD/CD-ROM, volatile or non-volatile media such as RAM (e.g. SDRAM, DDR, RDRAM, SRAM, etc.), ROM, etc. In some embodiments, a computer-accessible medium may include transmission media or signals such as electrical, electromagnetic, or digital signals, conveyed via a communication medium such as network and/or a wireless link.

The methods described herein may be implemented in software, hardware, or a combination thereof, in different embodiments. In addition, the order of the blocks of the methods may be changed, and various elements may be added, reordered, combined, omitted, modified, etc. Various modifications and changes may be made as would be obvious to a person skilled in the art having the benefit of this disclosure. The various embodiments described herein are meant to be illustrative and not limiting. Many variations, modifications, additions, and improvements are possible. Accordingly, plural instances may be provided for components described herein as a single instance. Boundaries between various components, operations and data stores are somewhat arbitrary, and particular operations are illustrated in the context of specific illustrative configurations. Other allocations of functionality are envisioned and may fall within the scope of claims that follow. Finally, structures and functionality presented as discrete components in the example configurations may be implemented as a combined structure or component. These and other variations, modifications, additions, and improvements may fall within the scope of embodiments as defined in the claims that follow.

What is claimed is:

1. A method, comprising:
   creating a mask at a first surface of a first glass component for forming one or more optical prisms; and
   bonding, using a non-adhesive bonding process, a second glass component with the first glass component at the first surface of the first component forming the one or more optical prisms and such that the mask is between the first and second glass components,
   wherein the mask is configured to block at least visible light transmission within a portion of the one or more optical prisms and between the first glass component and the second glass component.

2. The method of claim 1, wherein the non-adhesive bonding process includes a fusion bonding process, an anodic bonding process, or a reactive bonding process.

3. The method of claim 1, wherein creating the mask at the first surface of the first glass component comprises forming the mask at the first surface using a physical vapor deposition (PVD) process, a chemical vapor deposition (CVD) process, or an atomic layer deposition (ALD) process.

4. The method of claim 1, wherein creating the mask at the first surface of the first glass component comprises printing the mask on the first surface of the first glass component.

5. The method of claim 4, wherein printing the mask at the first surface of the first glass component comprises screen-printing or digital-printing the mask, using glass frit, to the first surface of the first glass component.

6. The method of claim 4, wherein creating the mask at the first surface of the first glass component further comprises sealing the printed mask with the first glass component using a laser or thermal sintering process.

7. The method of claim 1, further comprising:
   applying a coating overlapping the mask at the first surface of the first glass component, prior to bonding the second glass component with the first glass component, wherein the coating includes at least one material of silicon oxide, barium oxide, sodium fluoride, aluminum oxide, or a mixed material, and wherein the mixed material includes a mixture of silicon oxide and at least one of titanium oxide or niobium oxide.

8. The method of claim 7, wherein applying the coating comprises forming the coating overlapping the mask at the first surface of at the first glass component using a chemical vapor deposition (CVD) process or a physical vapor deposition (PVD) process.

9. The method of claim 7, further comprising:
   polishing the coating on top of the mask at the first surface of the first glass, prior to bonding the second glass component with the first glass component.

10. The method of claim 1, further comprising:
    cutting the joined first and second glass components into a plurality of glass bars; and
    applying at least one of an anti-reflective (AR) or a high-reflective (HR) coating to one or more exterior surfaces of at least one glass bar.

11. The method of claim 10, further comprising:
    cutting the at least one glass bar into a plurality of dies, wherein each die corresponds to one of the one or more optical prisms; and
    applying a mask on top of the at least one of an AR or a HR coating at the one or more exterior surfaces of at least one die.

12. The method of claim 1, wherein the mask includes a black mask.

13. The method of claim 1, wherein the first and second glass components individually include a glass wafer.

14. A device, comprising:
    a lens;
    an image sensor; and
    an optical prism configured to fold visible light passing from the lens to guide the light through the optical prism to the image sensor, wherein the optical prism comprises:
       a first glass component including a mask at a first surface of the first glass component; and
       a second glass component bonded with the first glass component at the first surface of the first glass component, using a non-adhesive bonding process, such that the mask is embedded inside the optical prism between the first and second glass components,
       wherein the mask is configured to block light transmission within a portion of the optical prism and between the first glass component and the second glass component.

15. The device of claim 14, wherein the non-adhesive bonding process comprises a fusion bonding process, an anodic bonding process, or a reactive bonding process.

16. The device of claim 14, wherein the mask at the first surface of the first glass component comprises a mask formed at the first surface of the first glass component using a physical vapor deposition (PVD) process, a chemical vapor deposition (CVD) process, or an atomic layer deposition (ALD) process.

17. The device of claim 14, wherein the mask at the surface of the first glass component comprises a mask formed at the first surface of the first glass component using a printing-and-sintering process that includes (1) printing the mask on the first surface of the first glass component and (2) sealing the printed mask with the first glass component using a laser or thermal sintering process.

18. The device of claim 14, wherein the optical prism further comprises:

a coating overlapping the mask at the first surface of the first glass component inside the optical prism, wherein the coating includes at least one material of silicon oxide, barium oxide, sodium fluoride, aluminum oxide, or a mixed material, and wherein the mixed material includes a mixture of silicon oxide and at least one of titanium oxide or niobium oxide.

19. The device of claim 14, wherein the optical prism further comprises at least one of an anti-reflective (AR) or a high-reflective (HR) coating at one or more exterior surfaces of the optical prism.

20. A camera, comprising:

one or more lenses;

an image sensor; and an optical prism placed optically between the one or more lenses and the image sensor, wherein forming the optical prism comprises:

creating a mask at a first surface of a first glass component; and bonding, using a non-adhesive bonding process, a second glass component with the first glass component at the first surface of the first component to form the optical prism with the mask embedded inside the optical prism between the first and second glass components, wherein the mask is configured to block visible light transmission within a portion of the optical prism and between the first glass component and the second glass component.

*   *   *   *   *